(12) United States Patent
Park et al.

(10) Patent No.: US 11,133,132 B2
(45) Date of Patent: Sep. 28, 2021

(54) ELECTRONIC COMPONENT AND BOARD HAVING THE SAME MOUNTED THEREON

(71) Applicant: SAMSUNG ELECTRO-MECHANICS CO., LTD., Suwon-si (KR)

(72) Inventors: Heung Kil Park, Suwon-si (KR); Se Hun Park, Suwon-si (KR); Hun Gyu Park, Suwon-si (KR); Tae Hoon Kim, Suwon-si (KR); Gu Won Ji, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/854,237

(22) Filed: Apr. 21, 2020

(65) Prior Publication Data

US 2021/0065983 A1 Mar. 4, 2021

(30) Foreign Application Priority Data

Aug. 29, 2019 (KR) .................. 10-2019-0106431

(51) Int. Cl.
*H01G 4/248* (2006.01)
*H01G 4/30* (2006.01)
(Continued)

(52) U.S. Cl.
CPC ............. *H01G 4/248* (2013.01); *H01G 4/232* (2013.01); *H01G 4/30* (2013.01); *H05K 1/111* (2013.01);
(Continued)

(58) Field of Classification Search
CPC .......... H01G 4/248; H01G 4/30; H01G 4/232; H05K 1/181; H05K 1/111; H05K 2201/2045; H05K 2201/10015
(Continued)

(56) References Cited

U.S. PATENT DOCUMENTS

| | | | |
|---|---|---|---|
| 2010/0188798 A1* | 7/2010 | Togashi | H01G 4/232 361/306.3 |
| 2014/0016242 A1 | 1/2014 | Hattori et al. | |
| 2014/0041914 A1 | 2/2014 | Hattori et al. | |

FOREIGN PATENT DOCUMENTS

| | | |
|---|---|---|
| JP | 2012-204572 A | 10/2012 |
| JP | 10-2019-0045748 A | 3/2016 |
| JP | 5888281 B2 | 3/2016 |

\* cited by examiner

*Primary Examiner* — Sherman Ng
(74) *Attorney, Agent, or Firm* — Morgan, Lewis & Bockius LLP

(57) ABSTRACT

A multilayer electronic component includes a capacitor body having first to six surfaces, the capacitor body including a dielectric layer and first and second internal electrodes having one ends exposed through the third and fourth sides, respectively, first and second external electrodes including first and second connection portions disposed on the third and fourth surfaces of the capacitor body, respectively, and first and second band portions spaced apart from each other on the first surface of the capacitor body, respectively, a first connection terminal disposed on the first band portion and having a first cutout disposed in a lower surface thereof, open toward the third surface of the capacitor body, and a second connection terminal disposed on the second band portion and having a second cutout formed in a lower surface thereof, open toward the fourth surface of the capacitor body.

21 Claims, 6 Drawing Sheets

(51) Int. Cl.
*H01G 4/232* (2006.01)
*H05K 1/18* (2006.01)
*H05K 1/11* (2006.01)

(52) U.S. Cl.
CPC ... *H05K 1/181* (2013.01); *H05K 2201/10015* (2013.01); *H05K 2201/2045* (2013.01)

(58) Field of Classification Search
USPC .......................................... 361/306.1, 306.3
See application file for complete search history.

ELECTRONIC COMPONENT AND BOARD HAVING THE SAME MOUNTED THEREON

CROSS-REFERENCE TO RELATED APPLICATION(S)

The present application claims the benefit of priority to Korean Patent Application No. 10-2019-0106431 filed on Aug. 29, 2019 in the Korean Intellectual Property Office, the entire disclosure of which is incorporated herein by reference.

BACKGROUND

1. Field

The present disclosure relates to a multilayer electronic component and a board having the same mounted thereon.

2. Description of Related Art

As a multilayer electronic component, a multilayer capacitor is formed of a dielectric material, the dielectric material is piezoelectric and thus may be modified in synchronization with applied voltage.

When the period of the applied voltage is within the audible frequency band, the displacement becomes vibrations and is transmitted to the substrate through solders, and the vibrations of the substrate is audible as sound. This sound is known as acoustic noise.

Such acoustic noise may be perceived as malfunctioning of the device by the user due to an abnormal sound when the operating environment of the device is quiet.

In addition, in a device having a voice circuit, the acoustic noise may be superimposed on the voice output to reduce the quality of the device.

In addition, apart from acoustic noise perceived by the human ear, when the piezoelectric vibrations of the multilayer capacitor are generated in a high frequency region of 20 kHz or more, malfunctioning of various sensors used in IT and industrial/electric and electronics devices may be caused.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a multilayer electronic component and a board having the same mounted thereon, in which a predetermined level or more of fixed strength may be secured while reducing acoustic noise in an audible frequency region below 20 kHz and high frequency vibrations of 20 kHz or more.

According to an aspect of the present disclosure, a multilayer electronic component includes a capacitor body having a first surface, as a mounting surface, a second surface opposing the first surface, a third surface and a fourth surface connected to the first and second surfaces and opposing each other, and a fifth surface and a sixth surface connected to the first and second surfaces, connected to the third and fourth surfaces and opposing each other, the capacitor body including a dielectric layer and first and second internal electrodes having one ends exposed through the third and fourth surfaces, respectively, first and second external electrodes including first and second connection portions disposed on the third and fourth surfaces of the capacitor body, respectively, and first and second band portions spaced apart from each other on the first surface of the capacitor body, respectively, a first connection terminal disposed on the first band portion and having a first cutout defined in a lower surface of the first connection terminal opposing the first surface of the capacitor body, the first cutout being open toward the third surface of the capacitor body, and a second connection terminal disposed on the second band portion and having a second cutout defined in a lower surface of the second connection terminal opposing the first surface of the capacitor body, the second cutout being open toward the fourth surface of the capacitor body.

The first and second band portions may include first and second solder accommodating portions below the first and second band portions, by the first and second cutouts, respectively. The first and second solder accommodating portions may not be in direct contact with the first and second band portions by upper surfaces of the first and second connection terminals, respectively.

Upper surfaces of the first and second connection terminals may be flat.

Areas of upper surfaces of the first and second connection terminals may be smaller than areas of the first and second band portions, respectively.

Length-width cross sections of the first and second cutouts may be arc shaped.

Length-width cross sections of the first and second cutouts may have a quadrangular shape.

The first and second connection terminals may be comprised of a conductor.

The first and second connection terminals may be comprised of an insulator, and a conductor layer may be disposed on a surface of each the first and second connection terminals.

A conductive bonding layer may be disposed between the first band portion and an upper surface of the first connection terminal and between the second band portion and an upper surface of the second connection terminal, a conductive bonding layer may be disposed.

According to an aspect of the present disclosure, a board having a multilayer electronic component mounted thereon includes a substrate having first and second electrode pads on one surface thereof, and the multilayer electronic component mounted in such a manner that first and second connection terminals are mounted on and connected to the first and second electrode pads, respectively.

According to another aspect of the present disclosure, a multilayer electronic component includes a capacitor body having a first surface and a second surface opposing each other in a thickness direction of the capacitor body, a third surface and a fourth surface connected to the first and second surfaces and opposing each other in a length direction of the capacitor body, and a fifth surface and a sixth surface connected to the first, second, third, and fourth surfaces and opposing each other in a width direction of the capacitor body, the capacitor body including a dielectric layer and first and second internal electrodes having one ends exposed through the third and fourth surfaces, respectively; first and second external electrodes respectively including first and second connection portions disposed on the third and fourth surfaces of the capacitor body, respectively, and first and second band portions disposed on the first surface of the capacitor body and spaced apart from each other; and a first connection terminal and a second connection terminal disposed on the first and second band portions, respectively. Each of the first and second connection terminals includes a first-thickness portion and a second-thickness portion having thicknesses different from each other in the thickness direction. The thickness of the second-thickness portion of each of the first and second connection terminals is smaller than a thickness of the first-thickness portion of each of the first and second connection terminals.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
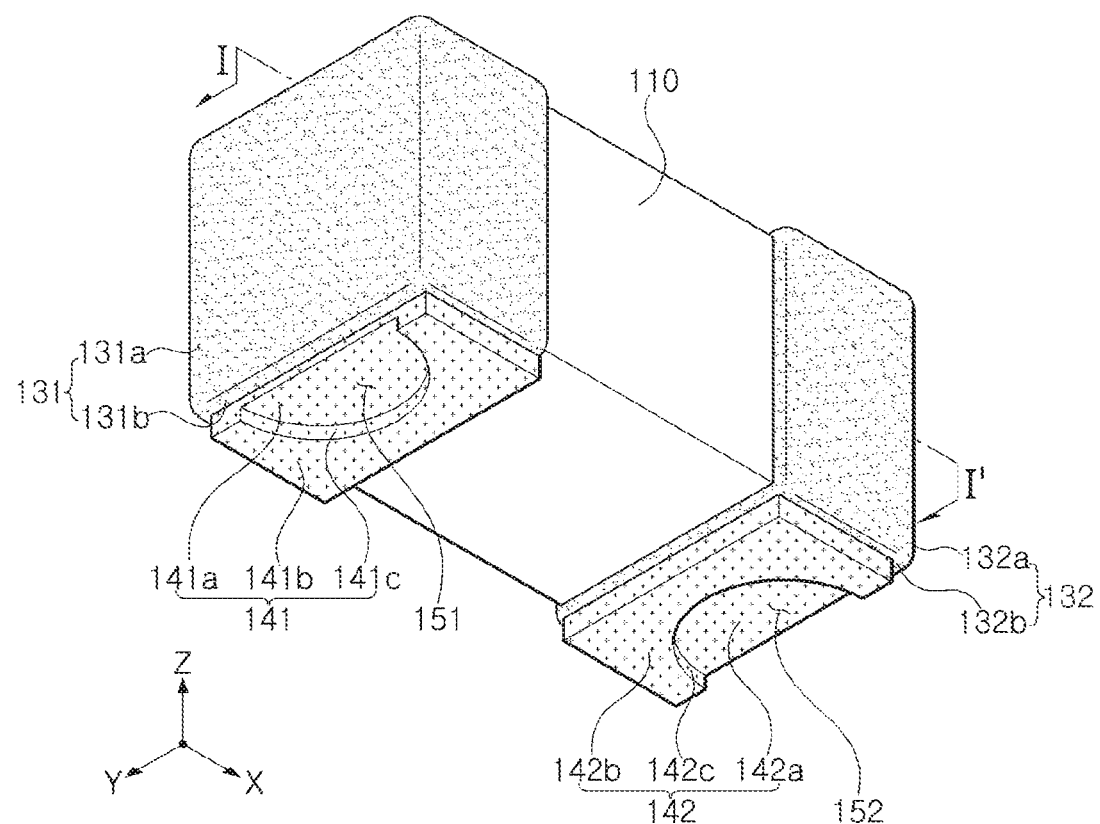
FIG. 1 is a perspective view schematically illustrating a multilayer electronic component according to an exemplary embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Figure 2:
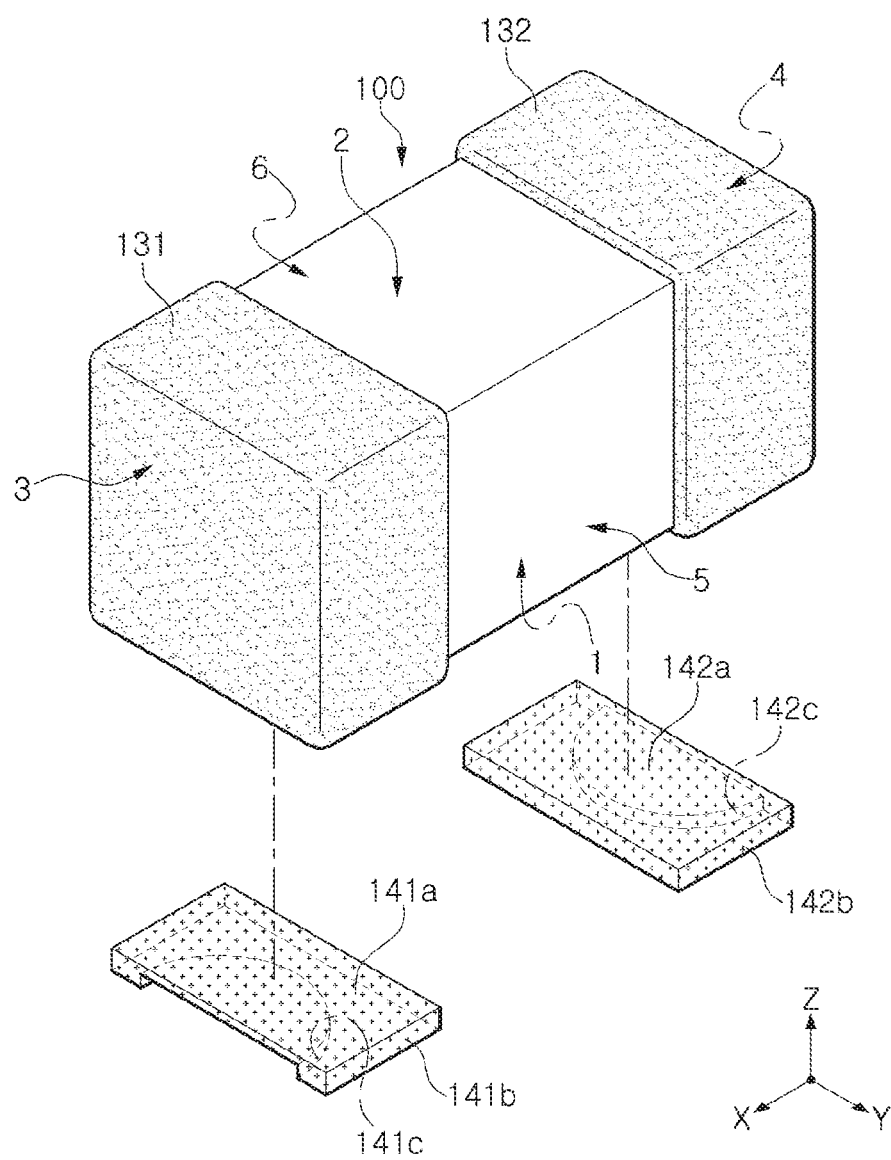
FIG. 2 is an exploded perspective view illustrating first and second connection terminals separated from each other in FIG. 1.
Figure 3:
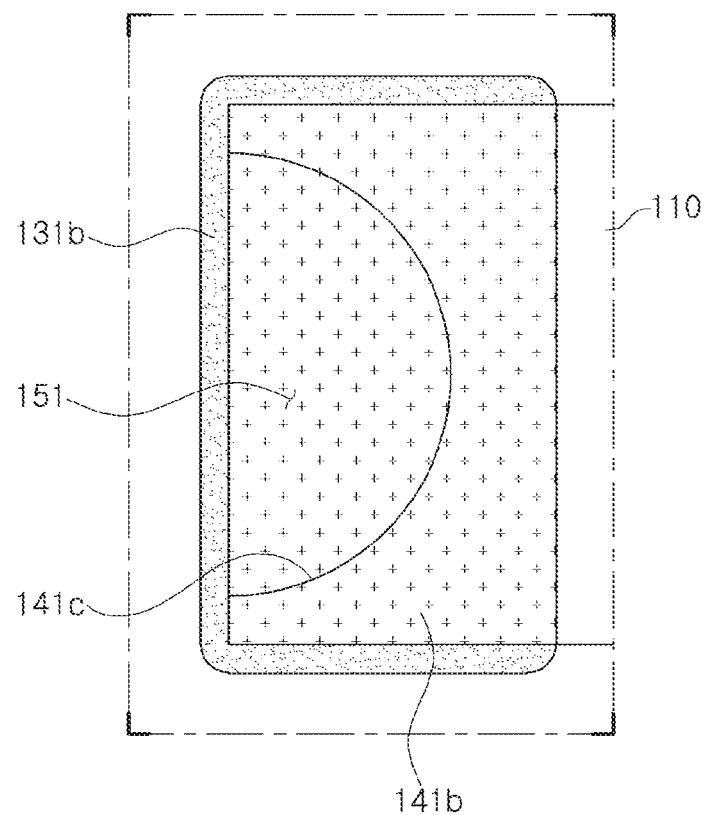
FIG. 3 is an enlarged bottom view illustrating a first band portion and a first connection terminal in FIG. 1.
Figure 4A:
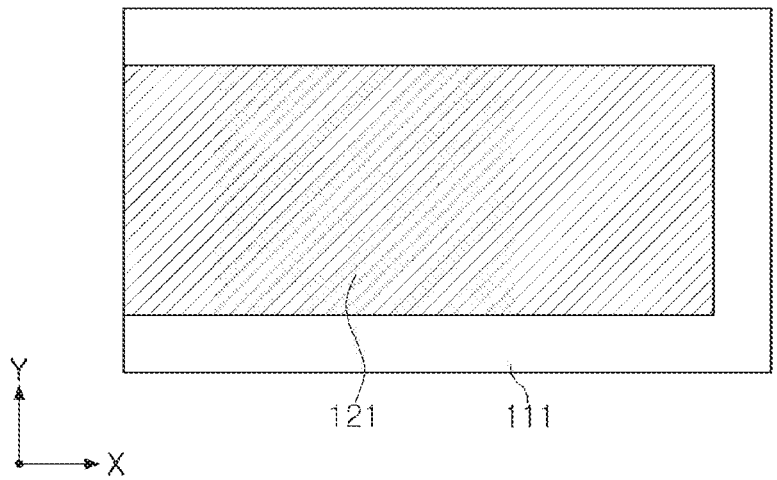
FIGS. 4A and 4B are plan views illustrating first and second internal electrodes of a multilayer electronic component according to an exemplary embodiment, respectively.
Figure 4B:
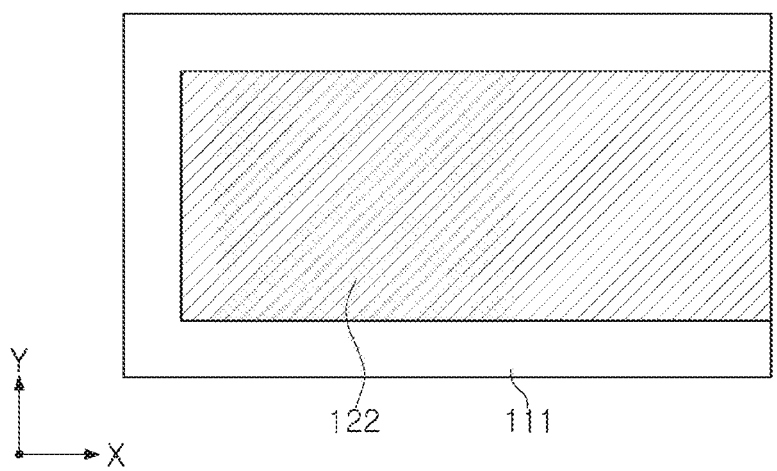
Figure 5:
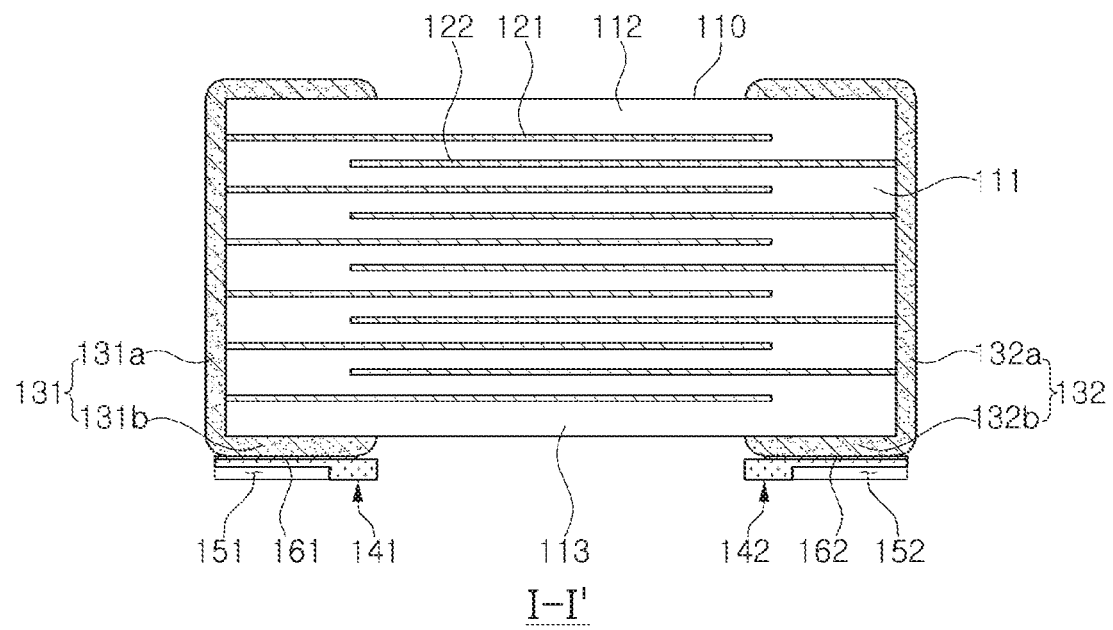
FIG. 5 is a cross-sectional view taken along line I-I' of FIG. 1.

FIG. 1 is a perspective view schematically illustrating a multilayer electronic component according to an exemplary embodiment. FIG. 2 is an exploded perspective view illustrating first and second connection terminals separated from each other in FIG. 1. FIG. 3 is an enlarged bottom view illustrating a first band portion and a first connection terminal in FIG. 1. FIGS. 4A and 4B are plan views illustrating first and second internal electrodes of a multilayer electronic component according to an exemplary embodiment, respectively. FIG. 5 is a cross-sectional view taken along line I-I' of FIG. 1.

Referring to FIGS. 1 to 5, a multilayer electronic component 100 according to an exemplary embodiment may include a multilayer capacitor including a capacitor body 110 and a plurality of external electrodes spaced apart from each other on a mounting surface of the capacitor body 110, and a plurality of connection terminals disposed on each external electrode.

Hereinafter, when defining the direction of the capacitor body 110 to clearly describe the embodiment of the present disclosure, X, Y and Z illustrated in the drawing indicates the length direction, width direction and thickness direction of the capacitor body 110, respectively. In addition, in this embodiment, the Z direction may be used to have the same concept as the stacking direction in which dielectric layers are stacked.

The capacitor body 110 is obtained by stacking a plurality of dielectric layers 111 in the Z direction, followed by firing, and includes a plurality of dielectric layer 111, and first and first internal electrodes 121 and 122 alternately disposed in the Z direction with the dielectric layer 111 interposed therebetween.

In addition, covers 112 and 113 having a predetermined thickness may be further formed on both sides of the capacitor body 110 in the Z direction.

In this case, the dielectric layers 111 of the capacitor body 110, adjacent to each other, may be integrated so that a boundary therebetween cannot be readily confirmed.

The capacitor body 110 may have a substantially hexahedral shape, but an embodiment thereof is not limited thereto.

In this embodiment, for convenience of description, both surfaces of the capacitor body 110 opposing each other in the Z direction may be defined as first and second surfaces 1 and 2, both surfaces of the capacitor body 10 connected to the first and second surfaces 1 and 2 and opposing each other in the X direction may be defined as third and fourth surfaces 3 and 4, and both surfaces thereof connected to the first and second surfaces 1 and 2, connected to the third and fourth surfaces 3 and 4 and opposing each other in the Y direction may be defined as fifth and sixth surfaces 5 and 6. In this embodiment, the first surface 1 may be a mounting surface.

In addition, the dielectric layer 111 may include a ceramic material having a high dielectric constant, and may include, for example, a $BaTiO_3$-based ceramic powder or the like, but an embodiment thereof is not limited thereto.

The $BaTiO_3$-based ceramic powder may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$ or the like, in which calcium (Ca), zirconium (Zr) or the like is partially solid-dissolved in $BaTiO_3$, but an embodiment thereof is not limited thereto.

In addition, a ceramic additive, an organic solvent, a plasticizer, a binder, a dispersant, and the like may be further added to the dielectric layer 111, together with the ceramic powder.

As the ceramic additive, for example, transition metal oxide or transition metal carbide, a rare earth element, magnesium (Mg), aluminum (Al) or the like may be used.

The first and second internal electrodes 121 and 122 are electrodes having different polarities, and are alternately disposed to face each other in the Z direction with the dielectric layer 111 interposed therebetween, and one ends of the first and second internal electrodes 121 and 122 may be exposed through the third and fourth surfaces 3 and 4 of the capacitor body 110, respectively.

In this case, the first and second internal electrodes 121 and 122 may be electrically insulated from each other by the dielectric layer 111 disposed therebetween.

The end portions of the first and second internal electrodes 121 and 122 alternately exposed through the third and fourth surfaces 3 and 4 of the capacitor body 110 may be electrically connected to first and second connection portions 131a and 132a of first and second external electrodes 131 and 132, respectively, disposed on the third and fourth surfaces 3 and 4 of the capacitor body 110, respectively.

In this case, the first and second internal electrodes 121 and 122 may be formed of a conductive metal, for example, a material such as nickel (Ni) or a nickel (Ni) alloy, but an embodiment thereof is not limited thereto.

In the configuration described above, when a predetermined voltage is applied to the first and second external electrodes 131 and 132, charges are accumulated between the first and second internal electrodes 121 and 122 facing each other.

In this case, the capacitance of the multilayer electronic component 100 may be proportional to the overlapped areas of the first and second internal electrodes 121 and 122 overlapping each other in the Z direction.

In this embodiment, the plurality of external electrodes may include first and second external electrodes 131 and 132.

The first and second external electrodes 131 and 132 are disposed to be spaced apart from each other in the X direction on the first surface 1, which is a mounting surface of the capacitor body 110, and voltages having different polarities are provided thereto. The first and second external electrodes 131 and 132 may be electrically connected to the exposed portions of the internal electrodes 121 and 122, respectively.

Plating layers may be formed on the surfaces of the first and second external electrodes 131 and 132 as necessary.

For example, each of the first and second external electrodes 131 and 132 may include a conductive layer, a nickel (Ni) plating layer formed on the conductive layer, and a tin (Sn) plating layer formed on the nickel plating layer.

The first external electrode 131 may include the first connection portion 131a and a first band portion 131b.

The first band portion 131b is disposed on a portion of the first surface 1 of the capacitor body 110, and is a portion to which a first connection terminal 141 is electrically connected.

The first connection portion 131a extends from the first band portion 131b to the third surface 3 of the capacitor body 110 and is a portion connected to the first internal electrode 121 exposed through the third surface 3 of the capacitor body 110.

In this case, the first band portion 131b may be further extended to a portion of the second surface 2 of the capacitor body 110 and portions of the fifth and sixth surfaces 5 and 6 when necessary for improving fixing strength.

The second external electrode 132 may include the second connection portion 132a and a second band portion 132b.

The second band portion 132b is disposed on the first surface 1 of the capacitor body 110 to be spaced apart therefrom in the X direction with the first band portion 131b, and is a portion to which a second connection terminal 142 is electrically connected.

The second connection portion 132a extends from the second band portion 132b to the fourth surface 4 of the capacitor body 110 and is a portion connected to the second internal electrode 122 exposed through the fourth surface 4 of the capacitor body 110.

In this case, the second band portion 132b may be further extended to a portion of the second surface 2 of the capacitor body 110 and portions of the fifth and sixth surfaces 5 and 6 when necessary for improving fixing strength.

The first connection terminal 141 may be disposed on the first band portion 131b of the first external electrode 131.

In this case, the first band portion 131b and the first connection terminal 141 may be bonded using a conductive adhesive such as high melting point solder or conductive paste.

Accordingly, a first conductive bonding layer 161 may be disposed between the first band portion 131b and the first connection terminal 141.

In this case, the first connection terminal 141 may be formed of an insulator as a non-conductive material, and may be formed of, for example, an insulation substrate or a circuit board such as FR4 or F-PCB, but an embodiment thereof is not limited thereto.

A conductor layer formed of a conductive metal may be formed on the surface of the first connection terminal 141.

The conductor layer may be formed of, for example, a plating layer such as a tin (Sn) or gold (Au) layer, but an embodiment thereof is not limited thereto.

A first cutout 141c may be formed in a bottom surface of the first connection terminal 141.

The first cutout 141c may be formed to be open in a direction of the third surface 3 of the capacitor body 110 in the X direction.

Accordingly, a first solder accommodating portion 151 as a solder pocket may be formed by the first cutout 141c, below the first band portion 131b of the first external electrode 131, on the first surface (1) side of the capacitor body 110.

In this case, an upper surface 141a of the first connection terminal 141 is formed to be a flat portion to which the first band portion 131b is connected, and may thus have an area greatly expanded.

Accordingly, the bonding strength of the first connection terminal may be improved by ensuring a maximum physical area in which the first band portion 131b and the first connection terminal 141 contact each other.

In this case, the first solder accommodating portion 151 may be distinguished from the first band portion 131b without directly contacting the first band portion 131b, by the upper surface 141a of the first connection terminal 141.

An area of the upper surface 141a of the first connection terminal 141 may be smaller than that of the first band portion 131b.

The first connection terminal 141 may be formed to cover a portion of the first surface 1 of the capacitor body 110 while deviating from the position of the first band portion 131b.

The lower surface 141b of the first connection terminal 141 is a portion connected to a substrate, and the first cutout 141c may serve to physically and electrically connect the upper surface 141a and the lower surface 141b of the first connection terminal 141.

The second connection terminal 142 may be disposed on the second band portion 132b of the second external electrode 132.

In this case, the second band portion 132b and the second connection terminal 142 may be bonded using a conductive adhesive such as high melting point solder or conductive paste.

Accordingly, a first conductive bonding layer 162 may be disposed between the second band portion 132b and the second connection terminal 142.

In this case, the second connection portion 142 may be formed of an insulator as a non-conductive material, for example, may be formed of an insulating substrate or a circuit board such as FR4, F-PCB, or the like, but an embodiment thereof is not limited thereto.

A conductive layer formed of a conductive metal may be formed on the surface of the second connection terminal 142.

The conductor layer may be formed of, for example, a plating layer such as a Sn or Au layer, but an embodiment thereof is not limited thereto.

A second cutout 142c may be formed in the bottom surface of the second connection terminal 142.

The second cutout 142c may be formed to be open in the direction of the fourth surface 4 of the capacitor body 110 in the X direction.

Accordingly, a second solder accommodating portion 152 as a solder pocket may be formed by the second cutout 142c, below the first band portion 132b of the second external electrode 132, on the first surface (1) side of the capacitor body 110.

In this case, an upper surface 142a of the second connection terminal 142 may be formed to be a flat portion to which the second band portion 132b is connected, and may thus have a greatly expanded area.

Accordingly, the bonding strength of the first connection terminal may be improved by ensuring a maximum physical area in which the second band portion 132b and the second connection terminal 142 contact each other.

In this case, the second solder accommodating portion 152 may be distinguished from the second band portion 132b without directly contacting the second band portion 132b, by the upper surface 142a of the second connection terminal 142.

An area of the upper surface 142a of the second connection terminal 142 may be smaller than that of the second band portion 132b.

The second connection terminal 142 may be formed to cover a portion of the first surface 1 of the capacitor body 110 while deviating from the position of the second band portion 132b.

A lower surface 142b of the second connection terminal 142 is a portion connected to the substrate, and the first cutout 142c may serve to electrically and physically connect the upper surface 142a and the lower surface 142b of the second connection terminal 142.

The first and second cutouts 141c and 142c may be formed to have an X-Y cross section in an arc shape, but an embodiment thereof is not limited thereto.

Figure 6:
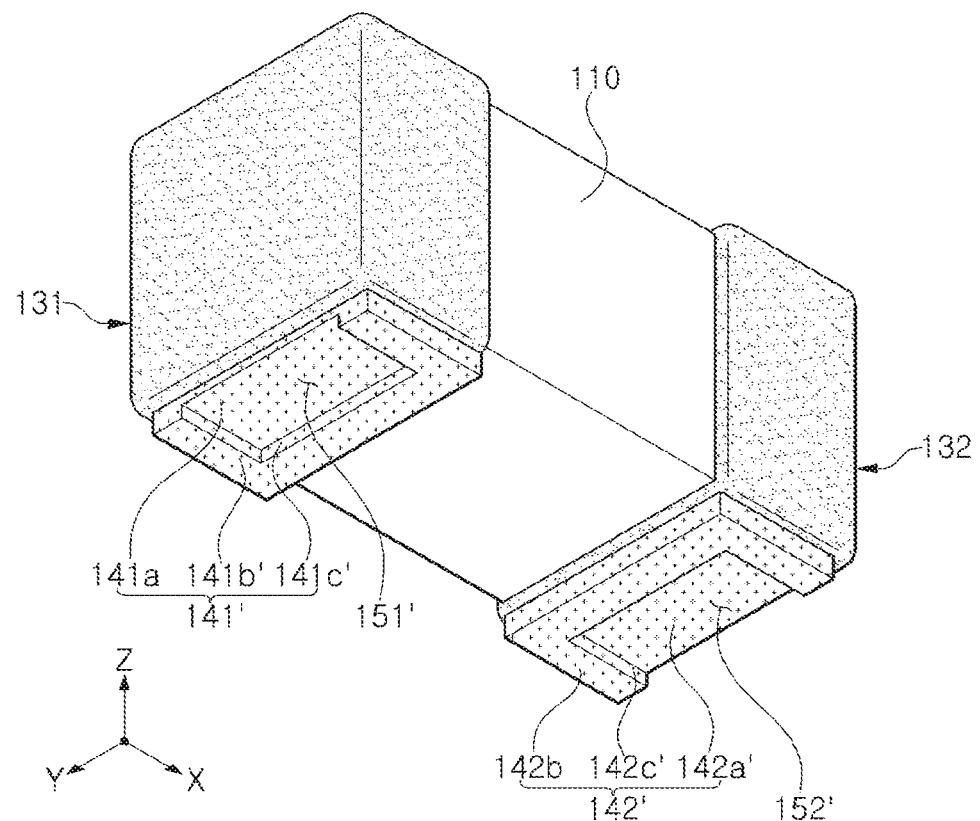
FIG. 6 is a perspective view schematically illustrating a multilayer electronic component according to another exemplary embodiment.

For example, as illustrated in FIG. 6, X-Y cross-sections of first and second cutouts 141c' and 142c' of the first and second connection terminals 141 and 142 may have a quadrangular shape. To this end, lower surfaces 141b' and 142b' of first and second connection terminals 141' and 142' may be formed to have a 'U' shape.

According to one exemplary embodiment, the first and second cutouts 141c, 142c may be arranged and configured such that in a bottom view of the first surface (1) of the multilayer electronic component, the first and second cutouts 141c, 142c have a semi-circular shape defined by straight lines and curved lines, respectively. Here, the straight lines may be in contact with outermost side surfaces of the first and second connection terminals 141 and 142, respectively, and the curved lines may extend inwardly in the length direction of the capacitor body in which the third (3) and fourth (4) surfaces oppose to each other. In addition, the first and second cutouts 141c, 142c may be spaced apart from front and rear surfaces of the first and second connection terminals 141 and 142, respectively, in a width direction of the capacitor body 110 in which the fifth (5) and sixth (6) surfaces oppose to each other.

As in this embodiment, when the conductor layer is formed on the entire circumferential surface of the first and second connection terminals 141 and 142, soldering is performed on the entire circumferential surface of the first and second connection terminals 141 and 142, including the inside of the first and second cutouts 141c and 142c. In this case, the degree of distorting the positions of the multilayer capacitor and the substrate may be reduced when the multilayer capacitor is mounted on the substrate.

In addition, the bonding area between the first and second connection terminals 141 and 142 and the solder may be increased during soldering, thereby improving adhesion strength of the multilayer capacitor.

The first and second connection terminals 141 and 142 may allow the mounted substrate and capacitor body 110 to be spaced apart from each other by a predetermined distance, and solder may be trapped in the first and second solder accommodating portions 151 and 152. Thus, by suppressing the formation of solder fillet on the second surface 2 of the capacitor body 110, introduction of piezoelectric vibrations occurring in the capacitor body 110 into the substrate may be reduced.

To significantly increase the role of the first and second solder accommodating portions 151 and 152 to trap the solder therein, only the first and second cutouts 141c and 142c may be formed of a conductor.

On the other hand, the first and second connection terminals 141 and 142 in this embodiment may be formed of, for example, a conductor such as copper (Cu) or a Cu alloy.

For example, when the first and second connection terminals 141 and 142 are formed of a conductor, there is no need to form a separate conductor layer on the surfaces of the first and second connection terminals 141 and 142.

Figure 7:
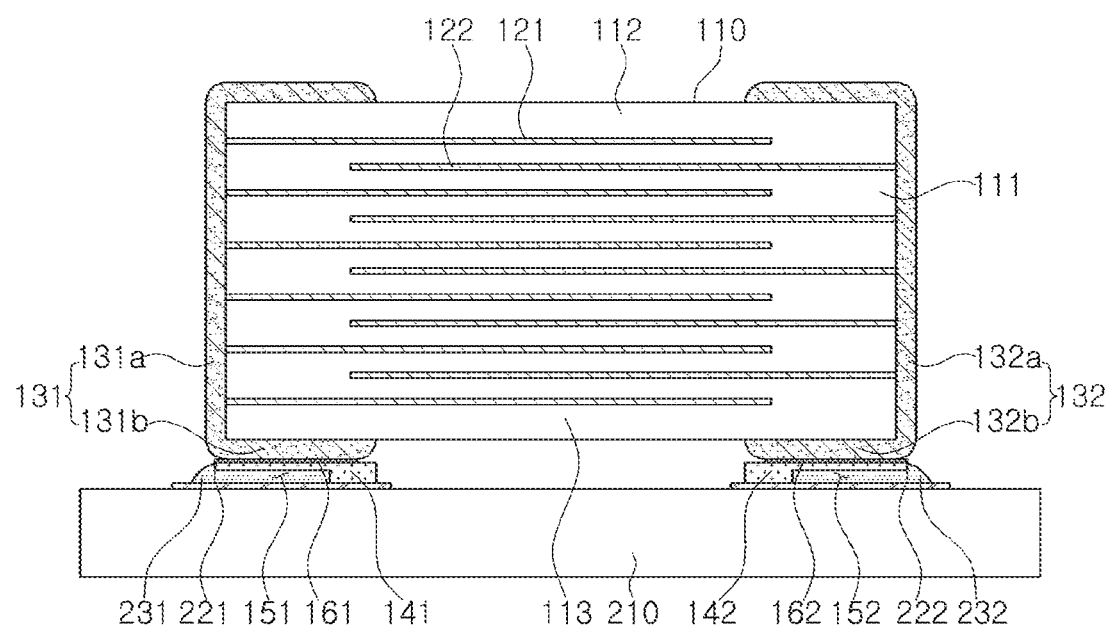
FIG. 7 is a cross-sectional view schematically illustrating a state in which a multilayer electronic component is mounted on a substrate according to an exemplary embodiment.

Referring to FIG. 7, a board having a multilayer electronic component mounted thereon, according to an exemplary embodiment may include a substrate 210 having first and second electrode pads 221 and 222 on one surface thereof, and a multilayer electronic component mounted on an upper surface of the substrate 210 in such a manner that the first and second connection terminals 141 and 142 are connected to the first and second electrode pads 221 and 222, respectively.

In this embodiment, the multilayer electronic component is illustrated and described as being mounted on the substrate 210 by solders 231 and 232, but a conductive paste may be used instead of the solder if necessary.

In a state in which the multilayer capacitor is mounted on the substrate, when voltages having different polarities are applied to the first and second external electrodes formed on the multilayer capacitor, the capacitor body may expand and contract in the Z direction due to an inverse piezoelectric effect of the dielectric layer. In this case, both ends of the first and second external electrodes are contracted and expanded in the opposite direction to the expansion and contraction of the capacitor body in the Z direction by the Poisson effect.

The contraction and expansion cause vibrations. In addition, the vibrations are transmitted to the substrate from the first and second external electrodes, the sound is radiated from the substrate to become acoustic noise.

When the multilayer capacitor is directly mounted on the substrate without the connection terminal, solder formed between the first and second external electrodes and the first and second electrode pads formed on one surface of the substrate is formed to have a predetermined height toward the second surface of the capacitor body. In this case, the vibrations generated by the multilayer capacitor may be transmitted to the substrate.

According to this embodiment, piezoelectric vibrations transmitted to the substrate through the first and second external electrodes 131 and 132 of the multilayer electronic component 100 may be absorbed by the elasticity of the first and second connection terminals 141 and 142 formed of an insulator as a soft material, thereby reducing acoustic noise.

In this case, the first and second solder accommodating portions 151 and 152 provided by the first and second cutouts 141c and 142c of the first and second connection terminals 141 and 142, respectively, may serve as solder pockets to trap solders 231 and 232 therein.

Accordingly, the solders 231 and 232 are effectively confined in the first and second solder accommodating portions 151 and 152, thereby reducing the height of the solder fillet toward the second surface of the capacitor body 110.

Accordingly, an effect of reducing acoustic noise may be greatly improved, by blocking the piezoelectric vibrations transmission path of the multilayer electronic component 100 and allowing maximum displacement points in the capacitor body 110 and the solder fillet to be spaced apart, as compared with the case in which the multilayer capacitor is directly mounted on the substrate without the connection terminal.

In addition, according to the structure of the multilayer electronic component in this embodiment, the acoustic noise reduction structure may effectively suppress the amount of vibrations that the piezoelectric vibrations of the multilayer electronic component is transmitted to the substrate at an audible frequency of the multilayer electronic component within 20 kHz.

In addition, by reducing the high frequency vibrations of multilayer electronic components, malfunctions of sensors that may be problematic by high frequency vibrations of 20 kHz or higher of electronic components may be prevented in IT or industrial/electric and electronic fields, and internal fatigue accumulation due to long time vibrations of sensors may be suppressed.

As set forth above, according to an exemplary embodiment, acoustic noise in an audible frequency region of less than 20 kHz and high frequency vibrations of 20 kHz or more in a multilayer electronic component may be reduced, and a predetermined level or more of fixing strength may be secured.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayer electronic component comprising:
a capacitor body having a first surface, as a mounting surface, a second surface opposing the first surface, a third surface and a fourth surface connected to the first and second surfaces and opposing each other, and a fifth surface and a sixth surface connected to the first, second, third, and fourth surfaces and opposing each other, the capacitor body including a dielectric layer and first and second internal electrodes having one ends exposed through the third and fourth surfaces, respectively;
first and second external electrodes respectively including first and second connection portions disposed on the third and fourth surfaces of the capacitor body, respectively, and first and second band portions disposed on the first surface of the capacitor body and spaced apart from each other;
a first connection terminal disposed on the first band portion and having a first cutout defined in a lower surface of the first connection terminal opposing the first surface of the capacitor body, the first cutout being open toward the third surface of the capacitor body; and
a second connection terminal disposed on the second band portion and having a second cutout defined in a lower surface of the second connection terminal opposing the first surface of the capacitor body, the second cutout being open toward the fourth surface of the capacitor body,
wherein the first and second connection terminals include first and second solder accommodating portions below the first and second band portions, the first and second solder accommodating portions formed by the first and second cutouts, respectively, and
wherein the first and second solder accommodating portions are not in direct contact with the first and second band portions by upper surfaces of the first and second connection terminals, respectively, the upper surfaces opposing the lower surfaces of the first and second connection terminals, respectively.

2. The multilayer electronic component of claim 1, wherein upper surfaces of the first and second connection terminals are flat, the upper surfaces opposing the lower surfaces of the first and second connection terminals, respectively.

3. The multilayer electronic component of claim 1, wherein areas of upper surfaces of the first and second connection terminals are smaller than areas of the first and second band portions, respectively, the upper surfaces opposing the lower surfaces of the first and second connection terminals, respectively.

4. The multilayer electronic component of claim 1, wherein length-width cross sections of the first and second cutouts are arc shaped.

5. The multilayer electronic component of claim 1, wherein length-width cross sections of the first and second cutouts have a quadrangular shape.

6. The multilayer electronic component of claim 1, wherein the first and second cutouts are arranged and configured such that:
in a bottom view of the first surface of the multilayer electronic component, the first and second cutouts have a semi-circular shape defined by straight lines and curved lines, respectively, and
the straight lines are in contact with outermost side surfaces of the first and second connection terminals, respectively, and the curved lines extend inwardly in a length direction of the capacitor body in which the third and fourth surfaces oppose to each other, and
the first and second cutouts are spaced apart from front and rear surfaces of the first and second connection terminals, respectively, in a width direction of the capacitor body in which the fifth and sixth surfaces oppose to each other.

7. The multilayer electronic component of claim 1, wherein the first and second connection terminals are comprised of a conductor.

8. The multilayer electronic component of claim 1, wherein the first and second connection terminals are comprised of an insulator, and
a conductor layer is disposed on a surface of each of the first and second connection terminals.

9. The multilayer electronic component of claim 1, wherein a conductive bonding layer is disposed between the first band portion and an upper surface of the first connection terminal and between the second band portion and an upper surface of the second connection terminal, the upper surfaces of the first and second connection terminals opposing the lower surfaces of the first and second connection terminals, respectively.

10. A board having a multilayer electronic component mounted thereon, the board comprising:
a substrate having first and second electrode pads on one surface of the substrate; and
the multilayer electronic component according to claim 1,
wherein the multilayer electronic component and the board are configured such that the first and second connection terminals of the multilayer electronic component are mounted on and connected to the first and second electrode pads, respectively.

11. The multilayer electronic component of claim 1, wherein the first and second connection terminals are formed of copper (Cu) or a Cu alloy.

12. The multilayer electronic component of claim 1, wherein the first and second connection terminals are formed of a non-conductive material,
the first and second connection terminals include a conductor layer disposed on a surface of the first and second connection terminals, respectively, and
the conductor layer is a tin (Sn) plating layer or a gold (Au) plating layer.

13. A multilayer electronic component comprising:
a capacitor body having a first surface and a second surface opposing each other in a thickness direction of the capacitor body, a third surface and a fourth surface connected to the first and second surfaces and opposing each other in a length direction of the capacitor body, and a fifth surface and a sixth surface connected to the first, second, third, and fourth surfaces and opposing each other in a width direction of the capacitor body, the capacitor body including a dielectric layer and first and second internal electrodes having one ends exposed through the third and fourth surfaces, respectively;
first and second external electrodes respectively including first and second connection portions disposed on the third and fourth surfaces of the capacitor body, respectively, and first and second band portions disposed on the first surface of the capacitor body and spaced apart from each other; and a first connection terminal and a second connection terminal disposed on the first and second band portions, respectively, wherein each of the first and second connection terminals includes a first-thickness portion and a second-thickness portion having thicknesses different from each other in the thickness direction, wherein the thickness of the second-thickness portion of each of the first and second connection terminals is smaller than a thickness of the first-thickness portion of each of the first and second connection terminals, wherein the first and second connection terminals include first and second solder accommodating portions below the first and second band portions, the first and second solder accommodating portions formed by first and second cutouts, respectively, and disposed below the second-thickness portions of the first and second connection terminals, respectively, and wherein the first and second solder accommodating portions are not in direct contact with the first and second band portions by the second-thickness portions of the first and second connection terminals, respectively.

14. The multilayer electronic component of claim 13, wherein a lower surface of the second-thickness portion of each of the first and second connection terminals, in an opposite side of the first surface of the capacitor body, is higher in level than a lower surface of the first-thickness portion of each of the first and second connection terminals, based on a bottommost part of the multilayer electronic component.

15. The multilayer electronic component of claim 13, wherein the second-thickness portion of the first connection terminal extends from an outermost side surface of the first connection terminal to a portion of the first connection terminal in the length direction, and wherein the second-thickness portion of the second connection terminal extends from an outermost side surface of the second connection terminal to a portion of the second connection terminal in the length direction.

16. The multilayer electronic component of claim 13, wherein the first and second connection terminals are symmetrical in shape based on a center axis of the multilayer electronic component.

17. The multilayer electronic component of claim 13, wherein the second-thickness portion of the first connection terminal is spaced apart from front and rear surfaces of the first connection terminal in the width direction, and the second-thickness portion of the second connection terminal is spaced apart from front and rear surfaces of the second connection terminal in the width direction.

18. The multilayer electronic component of claim 13, wherein upper surfaces of the first and second connection terminals are flat, the upper surfaces opposing the lower surfaces of the first and second connection terminals, respectively.

19. The multilayer electronic component of claim 13, wherein areas of upper surfaces of the first and second connection terminals are smaller than areas of the first and second band portions, respectively, the upper surfaces opposing the lower surfaces of the first and second connection terminals, respectively.

20. The multilayer electronic component of claim 13, wherein the first and second connection terminals are formed of copper (Cu) or a Cu alloy.

21. The multilayer electronic component of claim 13, wherein the first and second connection terminals are formed of a non-conductive material, the first and second connection terminals include a conductor layer disposed on a surface of the first and second connection terminals, respectively, and the conductor layer is a tin (Sn) plating layer or a gold (Au) plating layer.

* * * * *